United States Patent [19]

Yasunaga

[11] Patent Number: 4,461,960
[45] Date of Patent: Jul. 24, 1984

[54] HIGH SPEED SWITCHING CIRCUIT

[76] Inventor: Soichiro Yasunaga, 2-28, Denenchofu, Ohta-ku, Tokyo, Japan

[21] Appl. No.: 549,009

[22] Filed: Nov. 4, 1983

Related U.S. Application Data

[63] Continuation of Ser. No. 428,805, Sep. 30, 1982, , which is a continuation of Ser. No. 147,858, May 8, 1980.

[51] Int. Cl.$^3$ ............................................. H03K 17/56
[52] U.S. Cl. ................................... 307/243; 307/241; 307/255; 307/270
[58] Field of Search ............... 307/241, 242, 255, 270, 307/243

[56] References Cited

U.S. PATENT DOCUMENTS

| | | | |
|---|---|---|---|
| 3,350,571 | 10/1967 | Moulton et al. | 307/241 |
| 3,665,220 | 5/1972 | Legler et al. | 307/241 |
| 4,000,428 | 12/1976 | Harshbarger | 307/255 |
| 4,032,795 | 6/1977 | Hale | 307/270 |

Primary Examiner—Stanley D. Miller
Assistant Examiner—B. P. Davis
Attorney, Agent, or Firm—William J. Daniel

[57] ABSTRACT

A switching circuit formed of a plurality of parallel channels, each channel including a control transistor, a compensating transistor and an output transistor arranged in series. The analog signals to be switched are applied each to an input terminal of a channel which is connected to the collector of the control transistor which is in turn connected to the base of the compensating transistor. A control signal is applied to a control input terminal for each channel which is connected to the base of the control transistor thereof having its emitter grounded. Thus, the application or not of a control pulse to the control terminal and then to the control transistor base determines whether an analog signal at the input terminal for the channel is applied to the base of the compensating transistor. The collector of the compensating transistor is connected to a supply voltage terminal and its emitter to the base of the output transistor having its collector connected to a supply voltage terminal and its emitter connected to an output terminal common to all channels. The control transistor is of opposite electrical polarity to the compensating transistor and functions as an emitter following circuit, delivering an output coinciding with the input to its base from the compensating transistor and thus corresponding to the analog input signal.

5 Claims, 2 Drawing Figures

HIGH SPEED SWITCHING CIRCUIT

This application is a continuation of application Ser. No. 428,805, filed Sept. 30, 1982 which is a continuation of application Ser. No. 147,858, filed May 8, 1980.

BACKGROUND OF THE INVENTION

1. Field of the Invention

This invention relates to a switching circuit for switching between a plurality of analog signals at high rate.

2. Description of the Prior Art

A multi-phenomena recording device of a multi-phenomena cathode ray oscillograph requires switching circuits for switching between a plurality of analog signals at high speed. Heretofore, a MOS field-effect transistor has been extensively employed as the switching circuit. However, the use of MOS FIELD-effect transistors as the switching circuits is still disadvantageous in that the operating range with respect to input voltages is limited, and when the input voltage exceeds a predetermined value, channel interference is caused, and spike noise is relatively high.

SUMMARY OF THE INVENTION

The foregoing disadvantages are avoided by a switching circuit which comprises: a plurality of switching transistors having their collectors connected through resistors to input terminals for the signals to be switched, their emitters grounded, and their bases connected to input terminals to which switching control signals are applied; and a plurality of switching units which are controlled by the outputs of the switching transistors, the switching units having output transistors with their emitters connected to a common load resistor and to the output terminal.

A compensating transistor is interposed between the control transistor and the output transistor of each switching channel, the compensating transistor having its base connected to the collector of the control transistor so that the application of a control pulse at the control terminal and thus to the control transistor of each channel determines whether the compensating transistor is activated to apply an emitter output signal to the base of the supply transistor. The supply transistor is connected to function as an emitter following circuit, delivering an output to the output terminal coinciding with the input to its base from the compensating transistor emitter.

Accordingly, an object of this invention is to provide a switching circuit in which the disadvantages inherent in conventional switching circuits have been eliminated.

These and other objects, advantages and features of the present invention will become more fully apparent from detailed consideration of the arrangement and construction of the constituent parts as set forth in the following detailed description when read in conjunction with the accompanying drawing.

DETAILED DESCRIPTION OF PREFERRED EMBODIMENTS

Figure 1:
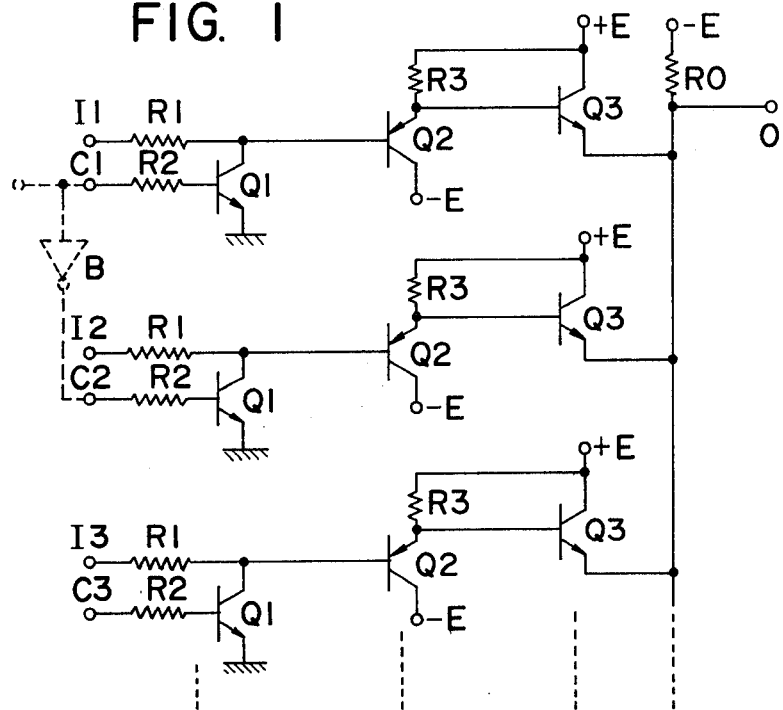
FIG. 1 is a circuit diagram showing one example of a switching circuit according to this invetion which as shown includes three separate channels for input signals, and is broken at the bottom to indicate the possibility of adding additional channels as needed or desired.

FIG. 1 is a circuit diagram showing one embodiment of a switching circuit according to this invention. The analog signals to be switched are applied to input terminals I1, I2, I3, and so on, while switching control signals are applied to control terminals C1, C2, C3, and so on. The input terminals I1, I2, I3, etc. are connected through resistors R1 to the collectors of the switching or control transistors Q1, the emitters of which are grounded, respectively. The terminals C1, C2, C3, etc. are connected through resistors R2 to the bases of the switching transistors Q1, respectively. The collectors of the transistors Q1 are connected to the bases of compensating transistors Q2, the collectors of which are connected to a supply terminal $-E$ at a negative voltage, respectively. The emitters of the transistors Q2 are connected through resistors R3 to a supply terminal $+E$ at a positive voltage, respectively. The emitters of the transistors Q2 are further connected to the bases of output transistors Q3, the collectors of which are connected to the supply terminal $+E$, respectively. The emitters of the output transistors Q3 are connected to a common output terminal O, which is connected through a load resistor R0 to the supply terminal $-E$.

In the thus arranged circuit, upon the application of a positive control voltage to any of the control terminals C1, C2, C3, etc., the corresponding switching transistor Q1 is rendered conductive, and accordingly the base of the corresponding compensating transistor Q2 is grounded therethrough. Therefore, the negative voltage at the terminal $-E$ is applied to the emitters of the transistors, as a result of which the corresponding output transistor Q3 is rendered non-conductive.

When, on the other hand, a negative control voltage is applied to any control terminal C1, C2, C3, etc., then the corresponding switching transistor Q1 is rendered non-conductive, and, therefore, the signal input at the corresponding input terminal I1, I2, I3, etc. is applied through its resistor R1 to the base of the corresponding compensating transistor Q2. Each compensating transistor Q2 functions as an emitter following circuit and delivers from the emitter an output signal following the input signal applied to its base. This output from transistor Q2 is applied to the base corresponding output of the transistor Q3, which also functions as an emitter following circuit and delivers an emitter output signal, following the input to its base, to the output terminal O.

As is clear from this description, so long as positive voltages are applied to the control terminals C1, C2, etc., the terminals I1, I2, I3, etc are effectively isolated from the output terminal O; but when a negative voltage is applied to any of the control terminals C1, C2, etc. then the input signal applied to the corresponding one of terminals I1, I2, I3, etc. is outputted through the output terminals, while any output corresponding to the original signals remaining at the other terminal C1, C2, etc. is interrupted or prevented because reverse voltages are applied between the bases and the emitters of the respective output transistors Q3.

Figure 2:
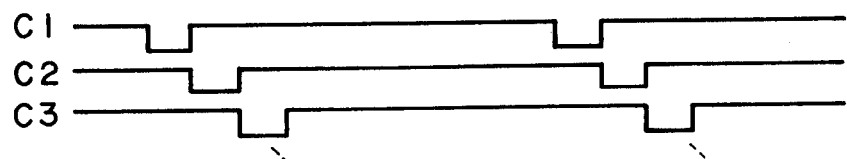
FIG. 2 is a waveform diagram illustrating the operation of the switching circuit shown in FIG. 1, the broken lines again indicating the option of additional channels.
Figure 2:
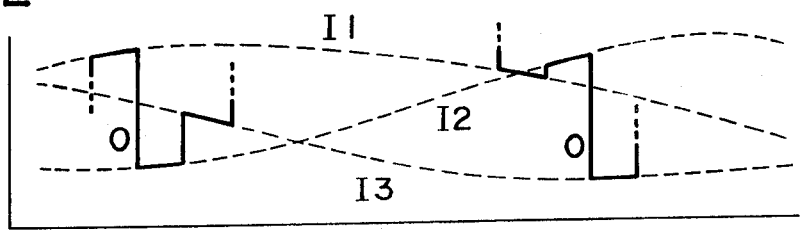

The circuit shown in FIG. 1 operates as described above. Therefore, when analog input voltage signals I1, I2, I3, etc., varying continuously as shown in the waveforms at the bottom of FIG. 2, are applied to the input terminals I1, I2, I3, etc. and negative control signal pulses C1, C2, C3, etc. as shown in the waveforms at the top of FIG. 2, are applied in sequence to control terminals C1, C2, C3, etc., then the circuit switches between signals I1, I2, I3, etc. under the direction of the control signal pulse and an output having in this case a stair step waveform designated by reference character O at the bottom of FIG. 2 is generated at the output terminal O.

The inclusion of the compensating transistors Q2 in the above-described circuit has important advantages. Where the output transistors Q3 are of the NPN type, the inclusion of compensating transistors Q2 of the PNP type with opposite conductivity thereto can prevent the difficulty that the output signal voltage is shifted by about 0.5 V because of the current rise voltage of the transistor. When a compensating transistor Q2 is not present, then the voltage at the output terminal O is lower by about 0.5 V than the input signal voltage. However, a transistor Q2 interposed between the control transistor and output transistor, then the voltage at the emitter becomes higher by about 0.5 V than the voltage at the base, and therefore, the increase and decrease in voltages are cancelled by each other, with the result that the output signal voltage coincides with the input signal voltage. Thus, each compensating transistor Q2 has a function of compensating for the amount of shift of the output voltage and a function of impedance conversion. When input signals to be switched are applied to only two input terminals I1 and I2, or only two channels are included in the switching circuit, these input signals can be alternatively switched by a simplified technique in which, as indicated by the dotted line in FIG. 1, a polarity inverting circuit B is inserted between the terminals C1 and C2, and a single square wave control signal pulse is applied to only one of terminals C1, C2. Thus, control terminals C1 and C2 alternatively receive negative and positive control signals, derived from the single control signal pulse, in that when a positive control signal is applied to terminal C1, control terminal C2 receives via inverter B a negative signal and when the control signal at terminal C1 changes to negative, the signal received at terminal C2 becomes positive. Consequently, the corresponding control transistors Q1, Q2 are alternatively energized.

As is apparent from the above description, in the circuit of the invention, the individual signal circuits to be switched are grounded by means of the switching transistors Q1 to block the passages of the signals. Therefore, with the circuit of the invention, spike noise is considerably small and switching can be effected stably at high rate. In addition, an increase in the supply voltage provides excellent effects in that high voltage signals can be readily switched and no interference is caused between the channels.

While the present invention has been described with reference to a particular embodiment and certain modifications thereof, it will be understood that numerous other modifications may be made by those skilled in the art without actually departing from the spirit and scope of the invention as defined in the appended claims.

What is claimed is:

1. A switching circuit comprising: a plurality of switching channels each comprising a control transistor having its collector connected through a resistor to an input analog signal terminal to which an analog signal to be switched is applied, its emitter grounded, and its base connected to a control input terminal to which a switching control signal is applied; a compensating transistor having its base connected to the collector of said control transistor, its emitter connected to a load resistor, and its collector connected to a supply terminal; an output transistor opposite in polarity to said compensating transistor having its collector connected to a supply terminal, and its emitter connected to a load resistor and to an output terminal common to all such channels; and means for establishing a low resistance path between the base of said output transistor and the emitter of said compensating transistor whereby the polarity of a control signal applied to the base of each said control transistor determines the delivery or not of said analog signal to the base of the corresponding compensating transistor and the consequential emission from the corresponding output transistor to said common output terminal of an output signal substantially equal to said applied analog signal.

2. The switching circuit according to claim 1, wherein said analog signals to be switched are applied to only two of said input terminals, and a polarity inverting circuit is inserted between the two corresponding control input terminals.

3. The switching circuit according to claim 1, wherein each said control signal input terminal is connected through a resistor to the base of said control transistor.

4. The switching circuit according to claim 1, wherein the collector of each compensating transistor is connected to a negative voltage supply terminal, the emitter of each said compensating transistor and the collector of each said output transistor are connected to a positive voltage supply terminal, and the emitter of each said output transistor is connected via said load resistor to a negative voltage supply terminal.

5. The switching circuit of claim 4, wherein a common positive voltage supply terminal is connected to the collector of each output transistor and through a resistor to the emitter of said compensating transistor.

* * * * *